United States Patent
Cao et al.

(10) Patent No.: US 7,651,268 B2
(45) Date of Patent: Jan. 26, 2010

(54) METHOD AND TESTING EQUIPMENT FOR LEDS AND LASER DIODES

(75) Inventors: Desen Cao, Sandy, UT (US); Zhao-hui Lin, Salt Lake City, UT (US)

(73) Assignee: CAO Group, Inc., West Jordan, UT (US)

( * ) Notice: Subject to any disclaimer, the term of this patent is extended or adjusted under 35 U.S.C. 154(b) by 191 days.

(21) Appl. No.: 11/678,243

(22) Filed: Feb. 23, 2007

(65) Prior Publication Data

US 2008/0205482 A1 Aug. 28, 2008

(51) Int. Cl.
*G01K 7/00* (2006.01)
(52) U.S. Cl. .................. 374/178; 374/104; 327/512
(58) Field of Classification Search .......... 374/102, 374/104, 178; 327/512
See application file for complete search history.

(56) References Cited

U.S. PATENT DOCUMENTS

| | | | | |
|---|---|---|---|---|
| 5,029,245 A * | 7/1991 | Keranen et al. | | 250/205 |
| 5,477,853 A * | 12/1995 | Farkas et al. | | 600/310 |
| 7,227,634 B2 * | 6/2007 | Cunningham | | 356/300 |
| 2006/0028122 A1 * | 2/2006 | Wang et al. | | 313/503 |
| 2006/0030762 A1 * | 2/2006 | David et al. | | 600/323 |
| 2008/0290251 A1 * | 11/2008 | Deurenberg et al. | | 250/201.1 |
| 2008/0297791 A1 * | 12/2008 | Imura | | 356/306 |

* cited by examiner

*Primary Examiner*—Gail Verbitsky
*Assistant Examiner*—Mirellys Jagan
(74) *Attorney, Agent, or Firm*—Geoffrey E. Dobbin

(57) ABSTRACT

The present invention is a non-invasive method and associated apparatus for determining the junction temperature for an LED or laser diode (collectively "LED"). First a sample LED is placed in a heat chamber and the change of the LED's peak wavelength is recorded over time, as is the change in the temperature in the heat chamber. Since the heat chamber supplies the major component to the junction temperature, dwarfing the other components, it is a reasonable proxy for true junction temperature. The data is compiled to determine change of peak wavelength as a function of temperature and that function can then be used to determine junction temperature of similar LEDs that are installed in a system or manufactured. The invention may also be used to measure other useful data, such as power, output power changing with the junction temperature and intensity of the LED over time and may be used to estimate failure rate.

8 Claims, 6 Drawing Sheets

METHOD AND TESTING EQUIPMENT FOR LEDS AND LASER DIODES

FIELD OF THE INVENTION

The present invention relates to the field of testing and diagnostic equipment and more particularly relates to a method and equipment for testing LEDs and laser diodes.

BACKGROUND OF THE INVENTION

Junction temperature affects the performances of both light emitting diodes (LEDs) and laser diodes in many ways. For simplicity, this Application and the appended claims shall use the terms "LED" and "diode" to include both LEDs and laser diodes and the terms should be read as including both types of diodes without limiting the Application or the claims to just LEDs. The light output wavelength, spectrum, power magnitude, and diode reliability are all directly dependent on the junction temperature. Thus, the thermal design of a diode itself and the packaging in which a diode is encased become crucial to the overall performance of the device. The diode junction temperature is generated from three main components: the internal thermal resistance of the diode, the external thermal resistance (from the contact thermal resistance and the heat sink thermal resistance) and the ambient temperature. In a system with either high powered LED, the variable junction temperature of the LED is of paramount concern. The validation of thermal design and assembly requires the ability to measure junction temperature. The current method of testing the junction temperature is to test the temperature coefficient with forward voltage. The changing rate of the diode forward voltage with the junction temperature depends on the band gap and its series resistance. This requires separation of the effect of serial resistance, which is difficult to do. Therefore, a non-invasive, quick test of the junction temperature and its variation is a very interesting topic in all areas of the applications and research of the LEDs and lasers.

The present invention is an optical method of measuring junction temperature that leaves an LED or laser system operating intact. It is based on the peak wavelength of the LED and the shift of that peak wavelength with junction temperature changes. It is a very useful method for high powered LEDs and lasers and high powered diode systems.

SUMMARY OF THE INVENTION

In view of the foregoing disadvantages inherent in the known types of testing procedures, this invention provides an improved testing method for LEDs and equipment for the same. As such, the present invention's general purpose is to provide a new and improved method that is non-invasive, non-destructive, and having a simple and quickly implemented procedure.

To accomplish these objectives, the method, in its basic form, comprises the steps of placing an LED in a heat chamber where both the LED and ambient temperature may be observed and measuring the output wavelength of the LED as a function of temperature. Then, the data is compiled and used to determine junction temperature based on wavelength.

The semiconductor band gap and the electron occupation situation of the lighting centers depend on the temperature. Previous studies have shown that the band gap energy of the semiconductor decreases with increasing temperature. In fact, the peak wavelength of the spectrum of the LED is determined by the occupation situation of the lighting centers. The occupation situation of the centers is depended on the concentration of the injected carrier concentration and the junction temperature. Therefore, in constant forward current, the dominant wavelength of the spectrum (the wavelength of the spectrum peak) of the LED depends on the junction temperature. When the junction temperature increases with constant concentration of the injected carrier, the peak wavelength will move to longer wavelengths.

The broad lighting spectrum of the LED (FIG. 1) shown there are multiple lighting centers in the semiconductor also (see FIG. 2). For example, if there are two lighting centers in the semiconductor as shown in FIG. 2, The hole concentration in E1 decreases with the increase of the temperature faster than E2 so that the peak wavelength of the lighting spectrum shift to longer wavelength because occupation at lighting center 1 goes down and occupation at lighting center 2 goes up. That means the thermal transfer and thermal contacted situation can be tested by the check of the shift value of the peak wavelength of the LED at constant concentration of the injected carriers, i.e. constant forward current. The peak wavelength of the spectrum of the LED as a function of the junction temperature can be tested predicts.

Once the relationship between the junction temperature and the peak wavelength is determined, the junction temperature of the LED can be tested by the peak wavelength value of the spectrum or peak wavelength changing value may be used to measure the changing of the junction temperature. So the junction temperature of the LED in its system can be tested by non-invasive means through the spectral shift measurements. The data is obtained by the testing the peak wavelength of the LED in different temperatures when the LED is activated using a short pulse forward current. The pulse duration time is determined by the measurement error of the junction temperature and the responsibility of the testing system. The $\Delta\lambda$ value (the changing value of the peak wavelength) is in response to the junction temperature directly. Therefore, measurement of the peak wavelength and its changing value can test the junction temperature and its changing value. In normally, that is took the related value measurement for some case only. The test of the temperature coefficient of the LED dominant wavelength is simpler than the test of the temperature coefficient of the forward voltage.

The junction temperature of the white LED can be tested by the shift of the peak wavelength. The blue peak in a white LED's spectrum is much sensitive with the junction temperature than its fluorescence peak, so the junction temperature and its changing situation can be tested by the blue peak of the white LED.

In many cases it is desired to estimate the failure rate at a new junction temperature based on the failure rate measured at another junction temperature. For example, if the failure rate of the LED is knew and typically measured the failure rate at the worst-case operating conditions (e.g. at the maximum operating current at the maximum allowable junction temperature), the failure rate at a more typical operating condition can be estimated.

The effect of the junction temperature on the failure rate follows the Arrhenius Model as below:

$$\lambda_2 = \lambda_1 \exp[(E_A/k)(1/T_1 - 1/T_2)]$$

Where:
$\lambda_1$=failure rate at junction temperature $T_1$,
$\lambda_2$=failure rate at junction temperature $T_2$,
$E_A$=activation energy, in units eV,
k=Boltzmann's constant,
T=junction temperature in Kelvin,
$\lambda$=failure rate=1/mean time to failure.

In general, the reliability in which a single component failure leads to system failure can be calculated as show below.

$$R(t)=\exp[-(\Sigma\lambda_i)(t)]$$

For a system consisting of n identical components, the reliability of a system is equal to:

$$R(t)=\exp[-\lambda nt].$$

Conversely, the probability of failure is $$P(t)=1-R(t).$$

In principle, the degradation rate of the LED can be estimated if the function of the LED output light power and the stress time are known. Also the LED system lifetimes can be estimated. However, this topic still needs a lot of research, but this equipment and method can monitor the device output power and test the degradation rate in non-invasive manner, leaving the operating system intact.

The more important features of the invention have thus been outlined in order that the more detailed description that follows may be better understood and in order that the present contribution to the art may better be appreciated. Additional features of the invention will be described hereinafter and will form the subject matter of the claims that follow.

Many objects of this invention will appear from the following description and appended claims, reference being made to the accompanying drawings forming a part of this specification wherein like reference characters designate corresponding parts in the several views.

Before explaining at least one embodiment of the invention in detail, it is to be understood that the invention is not limited in its application to the details of construction and the arrangements of the components set forth in the following description or illustrated in the drawings. The invention is capable of other embodiments and of being practiced and carried out in various ways. It is also to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF THE PREFERRED EMBODIMENT

With reference now to the drawings, the preferred embodiment of the LED testing method and apparatus is herein described. It should be noted that the articles "a", "an" and "the", as used in this specification, include plural referents unless the content clearly dictates otherwise.

Figure 1:
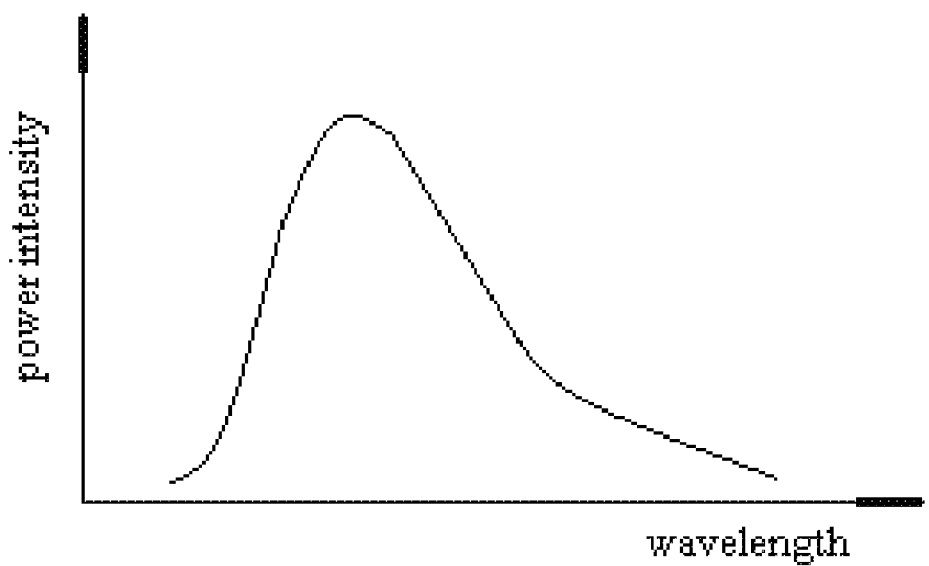
FIG. 1 is a representative spectrum for a color LED.
Figure 2:
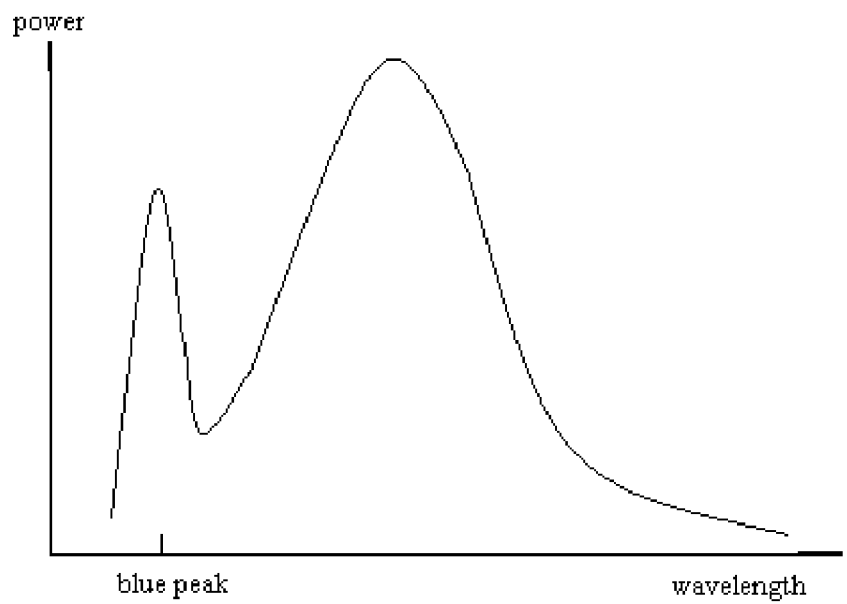
FIG. 2 is a representative spectrum for a white LED.
Figure 3:
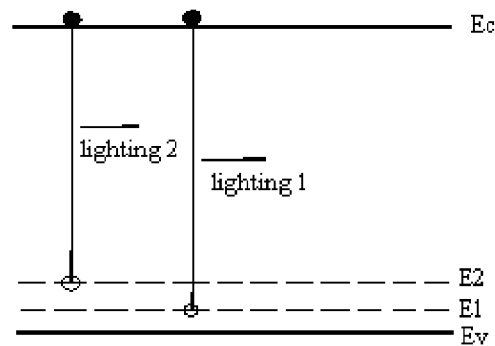
FIG. 3 is a representative energy level diagram for an LED with two lighting centers.
Figure 4:
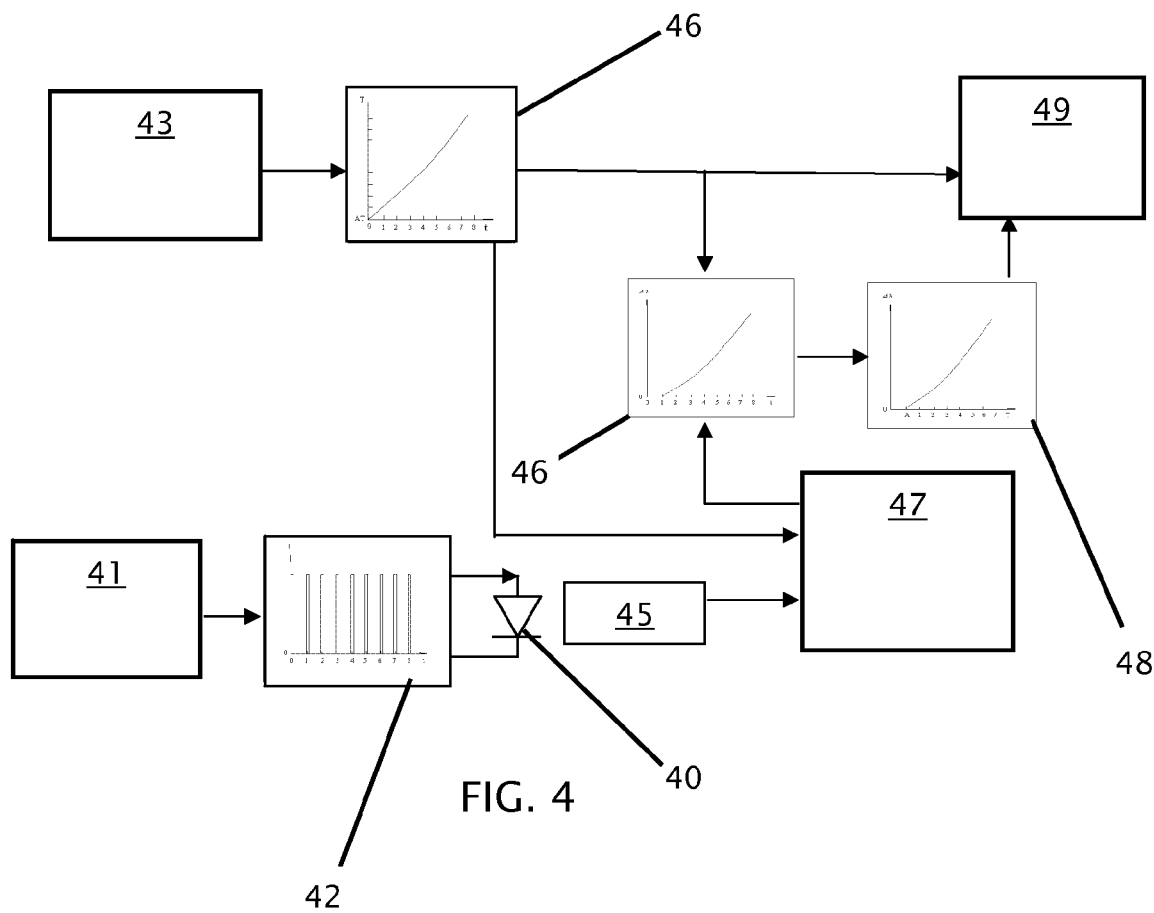
FIG. 4 is a schematic of the testing equipment according to the present invention.
Figure 10:
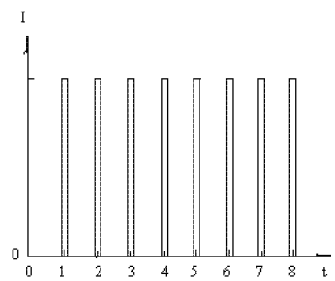
FIG. 10 is a graph depicting the pulse current powering the LED used in the present invention.
Figure 11:
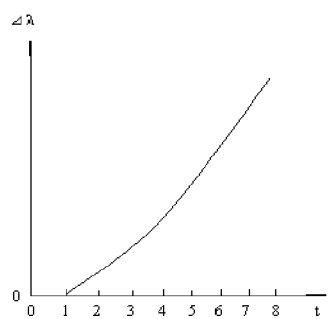
FIG. 11 is a representative graph depicting change in peak wavelength of an Led tested according to the method of the present invention.
Figure 12:
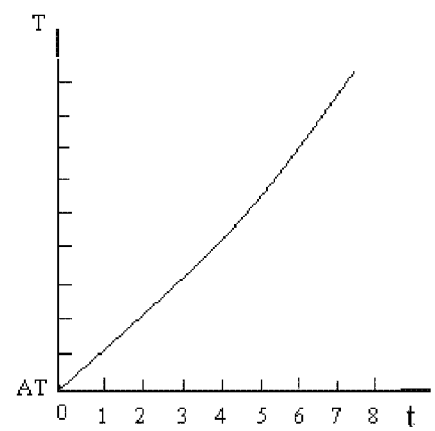
FIG. 12 is a representative graph depicting change in temperature inside the heat chamber used in the present invention.
Figure 13:
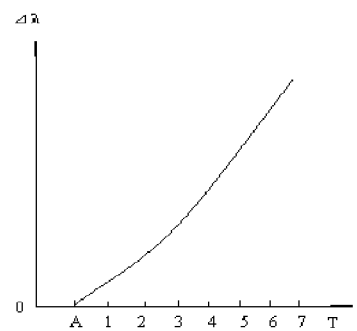
FIG. 13 is a representative graph depicting change in peak wavelength as a function of junction temperature.

The first step in the method according to the present invention is to determine the function of the peak wavelength of the LED as a function of temperature, so that the function may be used in later testing. The function may be determined with direct observation of an LED in an apparatus such as the one depicted schematically in FIG. 4. In practice, an LED 40, of a known type may be connector to a power supply 41 and located in a heat chamber 43. The power supply 41 then drives the LED 40 with a constant forward pulse current 42 (FIG. 10), activating it and guaranteeing that carrier injection level is constant. Data regarding the spectrum is gathered by a detector 45 and compiled by a spectrometer 47. This data regarding change in peak wavelength over time 46 (FIG. 11) is then transmitted to a computer 49. While in operation, the temperature in the heat chamber 43 rises and becomes the only significant component for the junction temperature. Raw data of temperature over time 44 (FIG. 12) is also sent to computer 49 for final compilation to determine the LED's function of wavelength to temperature 48 (FIG. 13). This resultant final compilation can be used to testing the junction temperature an LED of the same type and serial number, or of a device using the same type and serial number of LED, in a non-invasive manner, leaving operating system intact. It should be remembered that for white LEDs, the blue peak is measured.

The basic components of the apparatus are simple. The spectrometer 47 should measure wavelength in a range of 350 nm to 1000 nm and have a resolution of ±0.3 nm, though different resolutions could be provided. The electronic system should also be able to automatically adjust the testing signal level for the different lighting intensity.

Figure 6:
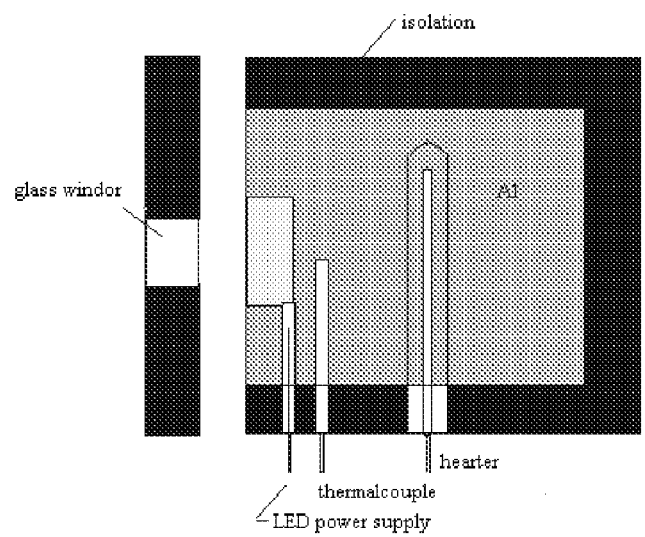
FIG. 6 is a cross section of a heat chamber for use with the present invention.
Figure 7:
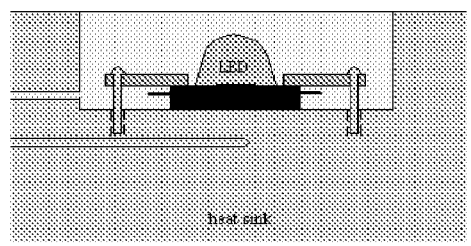
FIG. 7 is a partial section of a representative mounting means for use in the heat chamber of FIG. 6.
Figure 8:
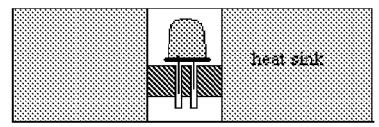
FIG. 8 is a partial section of another representative mounting means for use in the heat chamber of FIG. 6.

The heat chamber 42, shown in greater detail in FIG. 6, is a casing with an internal heat source 62 and a means of temperature measurement, such as thermocouple 64, operable connected to the computer 49. Internally, there is a mounting means 66 and a viewing port 68 so that changes in the LED spectrum may be measured by the detector 45. There is, of course connection means 61 connecting the LED to the power supply 41. Mounting means 66 will vary in structure dependant on the LED being tested and may be of a modular variety, with different LED mounting modules attachable to base structure. Some examples of mounting means, for Lumleds LEDs and 3 and 5 mm LEDs respectively are depicted in FIGS. 7 and 8. The depicted examples are in no way exhaustive or limiting to the invention, as diode structure will determine the requisite form of the mounting means 66. The only real requirements are that the means 66 allows for connection of the LED 40 to the power source 41 in a manner that the LED 40 may be observed by the detector 45 and that any heat sinks are appropriately used to provide thermal inertia and regulate the temperature as it affects the LED 40. The temperature of the heat chamber 43 should change in a near linear function with time, such as shown in FIG. 9.

Figure 9:
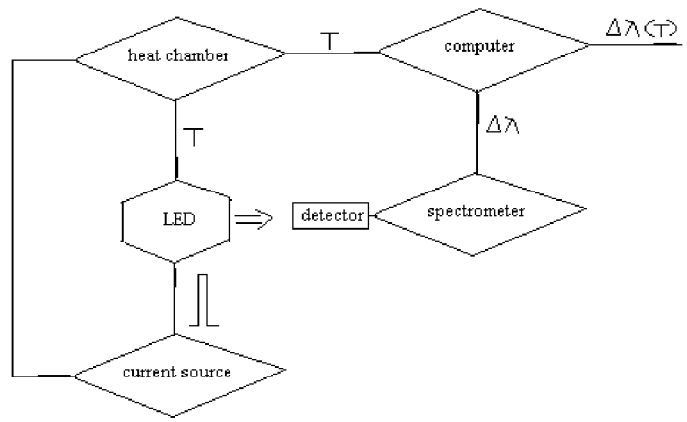
FIG. 9 is a schematic representing the logic for computer software to implement the present invention.

Software developed for the computer 49 displays a simple logic, depicted schematically in FIG. 9. The computer 49 receives data regarding temperature over time from the heat chamber 43, specifically from the thermocouple 64 or other measuring device. The computer 49 also receives data regarding spectra over the same time from the spectrometer 47. The two sets of data are compiled together to obtain the function of the peak wavelength over temperature.

Figure 5:
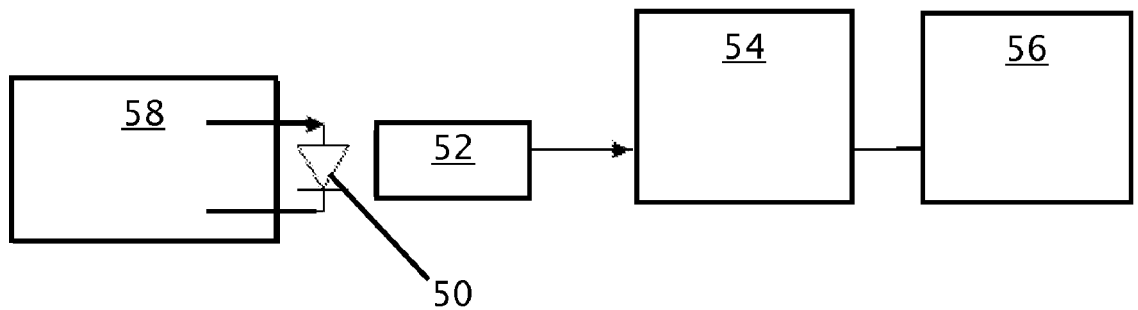
FIG. 5 is a schematic of testing equipment for diodes already installed in a system, according to the present invention.

Once the function is determined, that function may be used to measure the junction temperature of any other similar LED in a system. The apparatus for such a measurement is depicted in FIG. 5 and utilizes the spectral measurement components of the initial testing apparatus, namely a detector 52, spectrometer 54 and computer 56. The spectral data for the LED 50 in a system 58 is gathered and the computer 56 then compares the spectral data with the recorded function, thereby providing the junction temperature for the LED 50.

Figure 14:
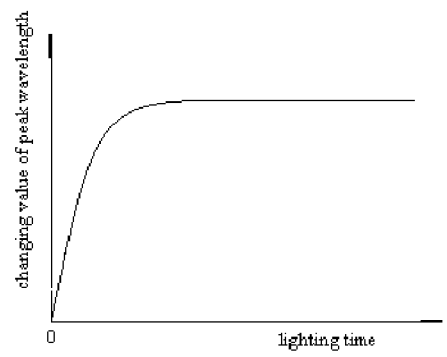
FIG. 14 is the changing value of the peak wavelength as a function of the lighting time, i.e. the changing rate of the junction temperature of the LED at constant forward current.
Figure 15:
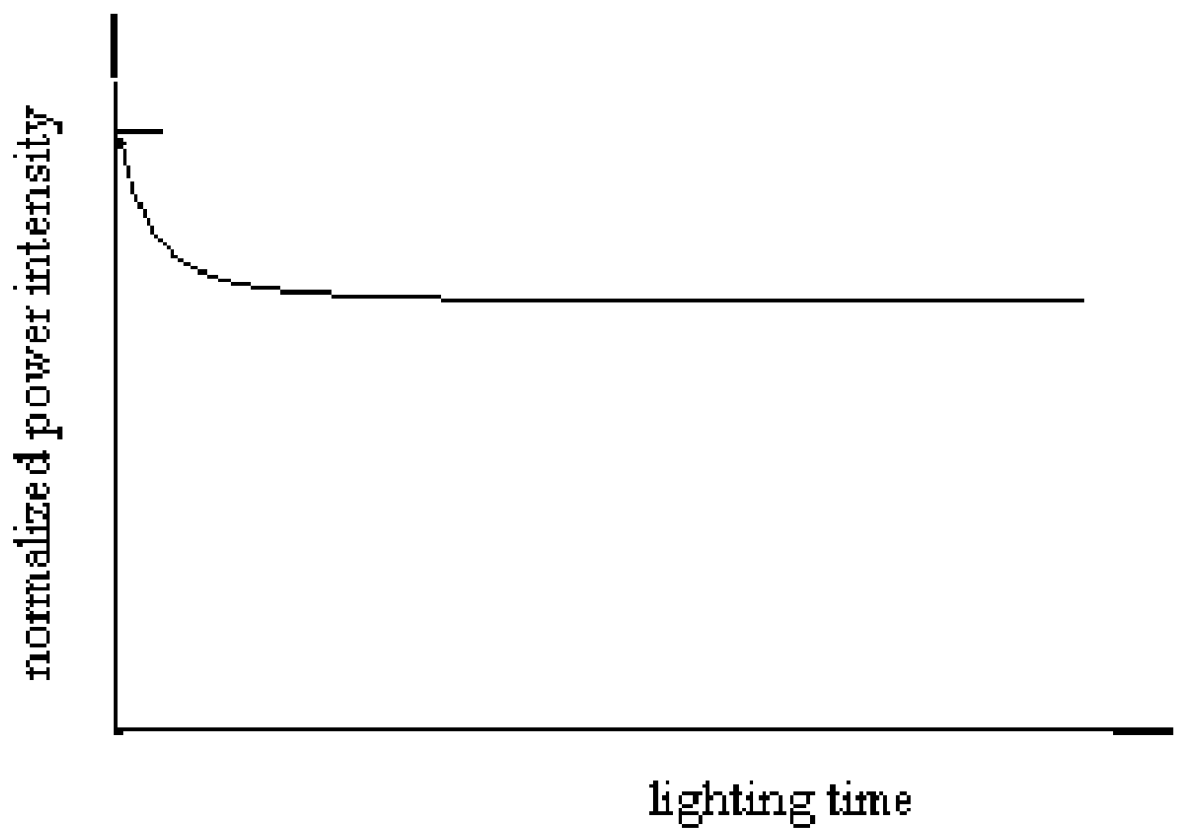
FIG. 15 is the output power of the LED as a function of the lighting time. It is shown the decreasing rate and the percentage of the output power of the LED.

The apparatus may also be used to measure the rate in which an LED's peak wavelength (FIG. 14) and power output (FIG. 15) will change over time. Both qualities are important when designing systems using LEDs as they can be used to estimate change in junction temperature and output power. In summary the following is a non-exhaustive list of LED and system characteristics that may be measured by the apparatus according to the present invention:

(1) Spectrum.
(2) Peak wavelength.
(3) Half width of the spectrum.
(4) Junction temperature at working current.
(5) Power (integrated intensity of the LED spectrum) as a function of temperature.
(6) The changing value of the peak wavelength $\Delta\lambda$.
(7) The changing value of the power vs. time, $\Delta P(t)$.
(8) $\Delta\lambda$ vs. time, $\Delta\lambda(t)$.
(9) The changing percentage of the output power.
(10) The changing percentage or changing value of the junction temperature
(11) The monitoring of the junction temperature and power of LED The versatility of the apparatus of the present invention tends to be useful in making many measurements for those using LEDs. In particular, manufacturers of systems using LEDs may test and measure the spectrum of the diode, test the dominant wavelength or the peak wavelength, test the spectral half width, test the temperature coefficient of the dominant wavelength or peak wavelength, check the contacting thermal resistance, measure the junction temperature at different forward current, test the integrated intensity (power), and monitor the changing of the characters of the LED or laser diode. Users and sellers of finished systems may check the junction temperature of the diode in the system while working, check, choose or changing the thermal transfer conditions, monitor the junction and its temperature, check the contacting thermal resistance, monitor the effect of the ambient temperature, and monitor the output power and the degradation rate of the device in the working system. Of course, all of these functions may be carried out in a non-invasive and non-destructive manner with the present method and apparatus, reducing cost.

Although the present invention has been described with reference to preferred embodiments, numerous modifications and variations can be made and still the result will come within the scope of the invention. No limitation with respect to the specific embodiments disclosed herein is intended or should be inferred.

What is claimed is:

1. A method of determining junction temperature for an LED, the method comprising:
    a. Placing a sample LED in a heat chamber;
    b. Powering the sample LED with a forward pulse current;
    c. Heating the chamber and recording a temperature of the heat chamber as a function of time;
    d. Measuring change in a peak wavelength of the sample LED as a function of time;
    e. Determining the function of the change of the peak wavelength as a function of temperature
    f. Using the function of the change of the peak wavelength as a function of temperature to determine junction temperature of a second LED, identical to the sample LED, by measuring a peak wavelength of the second LED for use in the function.

2. The method of claim 1 being used to determine the junction temperature of a white LED, wherein the measured peak wavelength is a spectral blue peak.

3. A method for determining the junction temperature of an LED, the method comprising:
    a. Determining the peak wavelength emitted by the LED;
    b. Comparing the peak wavelength to a given function relating the peak wavelength of an identical LED to junction temperature;
    c. Determining the junction temperature based upon the temperature associated with the measured peak wavelength in the given function.

4. A method for continuous monitoring of an LED's junction temperature comprising the method of claim 3 being continuously applied.

5. The method of claim 3, being utilized for a white LED, wherein the peak wavelength is the spectral blue peak.

6. A method for continuous monitoring of an LED's junction temperature comprising the method of claim 5 being continuously applied.

7. An apparatus for determining junction temperature of an LED, the apparatus comprising:
    a. An optical detector;
    b. A spectrometer;
    c. A computer, said computer being programmed with software for comparing peak wavelength data to peak wavelength data for an identical LED in relation to temperature.

8. An apparatus for determining an LED's junction temperature in relation to spectral data, the apparatus comprising:
    a. A heat chamber, said heat chamber further comprising a mounting structure for and capable of delivering electrical current to an LED and an observation window;
    b. A power supply capable of delivering a forward pulse current, operatively connected to the mounting structure;
    c. A thermocouple situated inside the heat chamber;
    d. A spectrometer and optical detector situated to measure spectral data emitted from an LED;
    e. A computer, operatively connected to the spectrometer and thermocouple;

wherein the computer stores and compiles data relating temperature and spectral data as functions of time obtained from the spectrometer and thermocouple to derive spectral data of an LED as a function of temperature.

* * * * *